United States Patent [19]

Hu et al.

[11] Patent Number: 5,671,112
[45] Date of Patent: Sep. 23, 1997

[54] DIGITAL INTEGRATOR V/HZ RELAY FOR GENERATOR AND TRANSFORMER OVER-EXCITATION PROTECTION

[75] Inventors: Yi Hu, Cary; David Hart, Raleigh; Damir Novosel, Cary, all of N.C.; Robert Smith, Boyertown, Pa.

[73] Assignee: ABB Power T&D Company, Inc., Raleigh, N.C.

[21] Appl. No.: 647,589

[22] Filed: May 13, 1996

[51] Int. Cl.$^6$ ............................................. H02H 3/18
[52] U.S. Cl. ........................ 361/86; 322/11; 322/23; 322/36; 364/483; 364/484; 364/494
[58] Field of Search ........................... 361/35, 78–79, 361/86, 88, 91, 111; 322/10–12, 28–29, 23–25, 36; 364/481, 483–484, 487, 494

[56] References Cited

U.S. PATENT DOCUMENTS

| | | | |
|---|---|---|---|
| 4,539,618 | 9/1985 | Stich | 361/94 |
| 4,639,817 | 1/1987 | Cooper et al. | 361/62 |
| 4,694,374 | 9/1987 | Verbanets, Jr. | 361/96 |
| 4,722,059 | 1/1988 | Engel et al. | 364/483 |
| 4,725,914 | 2/1988 | Garitty | 361/76 |
| 4,939,617 | 7/1990 | Hoffman et al. | 361/64 |
| 5,172,329 | 12/1992 | Rahman et al. | 364/483 |
| 5,224,011 | 6/1993 | Yalla et al. | 361/93 |
| 5,315,527 | 5/1994 | Beckwith | 364/483 |

Primary Examiner—Jeffrey A. Gaffin
Assistant Examiner—Michael J. Sherry
Attorney, Agent, or Firm—Woodcock Washburn Kurtz Mackiewicz & Norris LLP

[57] ABSTRACT

A system for implementing accurate V/Hz value measurement and trip time determination for generator/transformer overexcitation protection independent of the conventional frequency tracking and phasor estimation based on Discrete Fourier Transformation (DFT) techniques. A sampled sinusoidal voltage signal is passed through a digital integrator and the magnitude of the digital integrator's output is measured as representative of the V/Hz ratio. The digital integrator is implemented in software using a difference equation in a generator protection unit. The technique may be used with either a fixed or a variable sampling frequency. When the sampling frequency is variable, the filter coefficients of the digital integrator are recalculated on-line each time the sampling frequency is changed, and a new value for the peak magnitude of the output of the digital integrator is calculated using the recalculated filter coefficients. Non-linear frequency response characteristics of the voltage sensors and non-ideal characteristics of the digital integrator are also adjusted using the measured frequency and error-frequency characteristics of the particular digital integrator and voltage sensors used.

19 Claims, 12 Drawing Sheets

——— : IDEAL (|A|/ω)

- - - - : ACTUAL (|A|sqrt(ω^2+p^2))

(a) FREQUENCY RESPONSE

----: IDEAL(|A|/ω)　　　——: (|A|/sqrt(ω^2+p^2))

(b) ENLARGED FREQUENCY RESPONSE CURVE AT LOW FREQUENCY END (c) RELATIVE ERRORS BETWEEN THE IDEAL AND THE ACTUAL

4(b) SAMPLE INTERRUPT SUBROUTINE

4(a) MAIN PROGRAM

5(b) PROTECTION FUNCTION SUBROUTINE

5(a) MAIN PROGRAM (a) FREQUENCY RESPONSE CURVES (b) ENLARGED FREQUENCY RESPONSE AT LOW FREQUENCY END

DIGITAL INTEGRATOR V/HZ RELAY FOR GENERATOR AND TRANSFORMER OVER-EXCITATION PROTECTION

BACKGROUND OF THE INVENTION

1. Field of the Invention

The present invention relates to a technique for protecting generators and transformers from the damage caused by over-excitation by processing the sampled voltage signal to detect those conditions requiring control, alarm, and shut down of the generator or transformer. In particular, a digital integrator is used to provide accurate V/Hz value measurement and trip time determinations in the required V/Hz relay operating frequency range which is independent of the sampling frequency (either fixed or varying) and independent of other processing techniques, such as the Discrete Fourier Transform (DFT) technique, conventionally used in a digital relay protection system.

2. Description of the Prior Art

V/Hz relaying is conventionally used to protect generators and transformers from the damage caused by over-excitation, where the ratio of V/Hz is used as the measure of the generator's or transformer's over-excitation. As known to those skilled in the art, the excitation level of a generator or a transformer can be accurately measured by the ratio of the voltage magnitude over the frequency of a voltage impressed on them, thus the name V/Hz protection. Typically, the generator and transformer V/Hz protection function is required to work across the wide frequency range (5–80 Hz) which is experienced by a generator or a generator-transformer unit. Generally, a high V/Hz condition may occur during the start up or shut down of a generator when the speed of the generator is low and during a sudden load rejection or as a result of a certain system disturbance when the voltage suddenly becomes high while the frequency is only changed slightly or is not changed.

Conventional analog integrator type V/Hz relays (solid-state) can provide sufficient overexcitation protection in the desired frequency range with high accuracy. The analog integrator can be viewed as a special type of low-pass filter with a frequency response characteristic that is inversely proportional to the input signal's frequency. As shown in FIG. 1, the basic circuit of an analog V/Hz relay is an analog integrator 10. Those skilled in the art will appreciate that the analog integrator 10 shown in FIG. 1 is not an ideal integrator, but that it becomes an ideal integrator if $R_2$ is infinite. This characteristic causes the integrator 10 to become unstable. However, by carefully selecting the values of the $R_1$, $R_2$ and C, the integrator 10 can approach the ideal integrator and still remain stable.

The transfer function of the analog integrator 10 of FIG. 1 is $H(s)=A/(s-p)$, where $A=-1/R_1C$ and $p=-1R_2C$, and the frequency response of the integrator transfer function is obtained by substituting "s" with "j$\omega$", i.e.:

$$H(\omega) = H(s = j\omega) = \frac{A}{j\omega - p} \quad \text{Equation (1)}$$

and $$|H(\omega)| = \frac{|A|}{\sqrt{\omega^2 + p^2}} \approx \frac{|A|}{\omega} \text{ when } \omega \gg p \quad \text{Equation (2)}$$

Equation (2) shows that the magnitude of the output signal $V_o$ from analog integrator 10 is proportional to the magnitude of the input signal $V_i$ and inversely proportional to the frequency of the input signal, if $\omega \gg p$. For a practical circuit with $R_1=150$ k$\Omega$, $R_2=1$M$\Omega$, and $C=0.1$ $\mu$F, its parameters are: $A=-66.7$ and $p=-10$. The actual $|H(\omega)|$ and ideal ($|A|/\omega$) frequency response curves are plotted in FIGS. 2A and 2B and the relative error of $|H(\omega)|$ is plotted in FIG. 2C, where the relative error of $|H(\omega)|$ is defined as:

error (%) = \quad\quad Equation (3)

$$\left| \frac{\frac{A}{\sqrt{\omega^2+p^2}} - \frac{A}{\omega}}{\frac{A}{\omega}} \right| \times 100\% = \left| \frac{\omega}{\sqrt{\omega^2+p^2}} - 1 \right| \times 100\%$$

As FIGS. 2A–2C show, $|H(\omega)|$ and ideal ($|A|/\omega$) are very close to each other. Thus, the analog integrator 10 can be used for V/Hz protection across a wide frequency range. In fact, the analog integrator 10 of FIG. 1 could work down to very low frequencies and still maintain an acceptable accuracy (relative error <0.5% from 20 Hz and up and relative error <4% from 5 Hz and up, for the above example). Such an integrator is always stable provided the real part of "p" is less than zero, which is the case in the above example.

From the above error equation, the smaller the value of $|p|$ is, the smaller the relative error between $|H(\omega)|$51 of the above analog integrator and the ideal ($|A|/\omega$) is. However, since the transient response time constant of the circuit is $T_d=|1/p|$, the parameter p also determines the time delay of the circuit in response to a sudden change of the input signal. In the above example, the time constant is $T_d=\frac{1}{10}=0.1$ second, which is small. Thus, the parameter p could be chosen, such as in the above example, to obtain an $|H(\omega)|$ characteristic which is close to the ideal ($|A|/\omega$) without introducing excessive transient response time delay.

Those skilled in the art will also appreciate that the analog V/Hz relay uses a peak-detection circuit to determine the peak value of the output signal of the analog integrator, which is representative of the V/Hz value, to implement the inverse time delay characteristic, or a level detect circuit when a fixed time delay characteristic is used.

Digital V/Hz relay protection systems are generally known. For example, a prior art digital programmed over-excitation protective relay is described in U.S. Pat. No. 4,694,374 to Verbanets, Jr. The relay described by Verbanets, Jr. generates a first signal representative of the V/Hz value by integrating samples of a full cycle rectified voltage signal over a half cycle between two zero crossings using the trapezoidal or parabolic method or both. The first signal is then averaged over a predetermined period to generate a second signal, which is used to derive the time-to-trip for inverse time trip operation of the relay according to the disclosed method. The voltage signal used to compute the first signal is sampled at a predetermined fixed sampling frequency. Full cycle rectification circuits, zero-crossing detectors, and other special hardware are used to assist in the relay operation. The integration process of the half cycle sampled data is different depending on whether an even or odd number of samples is contained in the half cycle. A clean up procedure is applied to correct the error caused by the partial interval integration at the first and the last interval of a half cycle. Thus, in this relay, the first signal is a discrete signal which is output once in a half cycle, while the second signal is also a discrete signal which is output once in a predetermined period. However, the requirement of additional special hardware makes this type of V/Hz relay system less desirable.

The Discrete Fourier Transform (DFT) technique is conventionally used in digital protection systems to compute phasors of the input voltage and current signals for use by the different protection functions. To obtain an accurate DFT computation result, the samples used in the DFT computation must be taken from one fundamental cycle of the signal and be evenly spaced. If such sampling conditions are not met, the computed DFT phasors will be in error due to the well known spectrum leakage and picket fencing problems. In an integrated (multi-function) generator protection system using a DFT algorithm, the fundamental frequency of the voltage and current signals is not fixed but varies. As a result, the following techniques have to be used to compute the phasors correctly: (1) the sampling frequency is varied to keep a fixed number of samples per cycle which is equal to the fixed number of data points used in the DFT computation; or (2) the sampling is conducted at a fixed frequency but the DFT window length is varied to keep the number of data points used in the DFT computation equal to the number of samples in one cycle. In the varying sampling frequency approach, the frequency of the input voltage, which is used to dynamically change the sampling frequency, is obtained as the result of frequency tracking. In the varying DFT window approach, on the other hand, the frequency of the input voltage, which is used to change the DFT window length, is obtained as the result of frequency estimation using the DFT phasor angle difference.

The computation of the V/Hz value in an integrated digital generator protection system using either of the above-mentioned DFT-based techniques appears to be relatively straightforward, since on its face all that is required is dividing the measured voltage by the measured frequency. However, this approach cannot provide an accurate V/Hz measurement in the desired operating frequency range of a V/Hz relay as the frequency approaches zero, for neither of the two above-mentioned techniques are suitable at low frequencies due to aliasing (the need of a very low cutoff frequency filter), the response time (the need to wait for one cycle of data to become available), and other problems. If the anti-aliasing is not performed properly, errors will occur in the phasor computation according to the well-known Nyquist Theorem. To avoid such aliasing problems, the sampling frequency must be fixed at the value corresponding to the low frequency limit of the varying sampling frequency approach when the actual frequency is below that limit, or the DFT window length must be fixed at the length corresponding to the low frequency limit in the varying DFT window length approach when the actual frequency is below the limit. Unfortunately, even with such anti-aliasing measures applied, the phasor computation and the frequency estimation still contain errors for both DFT techniques when the actual frequency is below the low frequency limit established by the Nyquist Theorem, for the DFT is no longer performed on samples in a single cycle. Consequently, the V/Hz value computed using the voltage phasor and the estimated frequency is inaccurate when the actual frequency is below the low frequency limit, which may occur during a generator's start-up and shut-down process when its speed is low.

Unlike the V/Hz relay, most of the generator protection functions are only required to operate when a generator is running around its nominal speed. The operating frequency range provided by the varying sampling frequency approach or the varying DFT window length approach is thus sufficient for the correct operation of these protection functions. It would be advantageous for an integrated generator protection system to use DFT techniques for these functions while using other techniques to perform a more accurate V/Hz protection function and other protection functions which are required to operate in a much wider frequency range so that overall better system performance can be achieved. As will be described in detail below, the present invention has been designed to address this problem for fixed and variable sampling frequencies by directly computing an accurate V/Hz ratio from the sampled input voltage signal so that the results are similar or improved in comparison with the prior art analog circuit of FIG. 1.

Since the invention uses digital samples for the V/Hz trip determination, the invention is obviously different from an analog V/Hz relay using an analog integrator where both input and output signals are continuous signals. As will also be appreciated from the following detailed description, the invention further differs from the DFT based V/Hz relaying technique where the value of V/Hz is obtained by dividing the voltage magnitude by the frequency computed separately from the DFT and the frequency estimation technique in that the ratio of V/Hz of the sinusoidal input signal is obtained directly. In addition, the invention differs from the programmed overexcitation protective relay taught by Verbanets, Jr. since Verbanets, Jr. uses a non-recursive digital integration method supported by special hardware for the derivation of the V/Hz values by integrating samples of a full cycle rectified voltage signal over a half cycle between two zero crossings using trapezoidal or parabolic methods, or both. The integrated generator protection system of the invention does not require such additional hardware support for the V/Hz relay. Instead, the invention uses the same voltage samples as used by the above-mentioned DFT techniques to perform V/Hz relaying in the desired operating frequency range and operates independently regardless of the sampling frequency approach (fixed or varying) being used in the system. Details of the implementation of the invention will be provided in the following detailed description.

SUMMARY OF THE INVENTION

Digital Integrator type V/Hz relaying techniques in accordance with the invention avoid the afore-mentioned problems with the prior art by obtaining the ratio of V/Hz of a sinusoidal input signal directly. Digital Integrator type V/Hz relaying techniques in accordance with the invention are based on the integration of an input sinusoidal signal $x=B \sin(2\pi ft)$ (where f is the frequency of x, B is the amplitude of x, and t is time):

$$y = \int x\,dt = \int B \sin(2\pi ft)\,dt = -\frac{B}{2\pi f} \cos(2\pi ft)$$

As can be seen from the above equation, the magnitude of the integrated output signal y is inversely proportional to the frequency of the input signal x. Accordingly, the peak value of the integrated signal can be used to obtain the required V/Hz ratio. The present invention is based on this observation.

The invention relates to a programmed protective relay system for protecting power equipment, supplied with energy from at least one power line, against overexcitation by generating an overexcitation relay signal and providing the relay signal to a circuit breaker which separates the power equipment from a source of the overexcitation. In a preferred embodiment, the system comprises a voltage sensor for sensing a voltage of one or more power lines, frequency determining means for determining a frequency of the sensed voltage of the one or more power lines, analog to digital conversion means for sampling and digitizing the sensed voltage at a sampling frequency so as to form a digital voltage signal, a digital integrator for integrating the digital voltage signal in a manner independent of the sampling frequency, and processing means for calculating a voltage/frequency ratio of the power line(s) from a peak magnitude of an output of the digital integrator and the frequency determined by the frequency determining means. The relay signal is then generated when the voltage/frequency ratio exceeds a predetermined operating condition value.

The digital integrator of the invention is comprised of a digital filter having filter coefficients directly linked to the desired frequency response characteristic and the sampling frequency. The filter coefficient equations are obtained from the transfer function of the analog integrator using the difference equation mapping method. The digital integrator's filter coefficients can be recalculated and adjusted on-line each time the sampling frequency is changed to maintain a desired frequency response characteristic when the varying sampling approach is used. The filter coefficients are adjusted according to the actual sampling period at the time when the samples are taken. The digital integrator is then applied to the voltage samples to generate a first signal each time a sample is received, and the first signal is then digitally rectified to produce a second signal. The peak values of the second signal representative of the accurate V/Hz values are detected by a peak detector and is used together with the second signal to generate V/Hz relaying signals.

In accordance with a preferred embodiment of the invention, the digital filter of the digital integrator processes samples of the input voltage signal x directly from the above equation, where x=Bsin(2πft), "B" is the magnitude of the voltage signal, "f" is the frequency of the voltage signal, and "t" is time. One of the coefficients, i.e., the one which is to multiply with the previous time step's digital integrator's output, must be less than one to ensure that the digital integrator is stable. However, those skilled in the art will appreciate that this is the case when the digital integrator is designed using the difference equation mapping method in accordance with the invention.

In accordance with another aspect of the invention, the ratio-frequency characteristics of the voltage sensor and/or the digital integrator may be measured and stored, and then used with the fundamental frequency value measured on-line by other techniques to correct the nonlinear frequency response characteristics of the voltage sensors and/or to correct the non-ideal characteristics of the digital integrator.

Thus, in accordance with the invention, the V/Hz ratio is computed by performing the steps of sensing a voltage of one or more power lines, determining a frequency of the sensed voltage of the one or more power lines, sampling the sensed voltage at a sampling frequency so as to form a digital voltage signal, digitally integrating the digital voltage signal using a digital integrator in a manner independent of the sampling frequency, measuring a peak magnitude of an output of the digital integrator, and calculating a voltage/frequency ratio of the one or more power lines from the peak magnitude and the frequency determined in the frequency determining step. An overexcitation relay signal is then generated when the voltage/frequency ratio exceeds a predetermined value, and the relay signal is provided to a circuit breaker which separates the power equipment from a source of the overexcitation. For systems with variable sampling frequencies, the digital integrator's filter coefficients are adjusted when the sampling frequency is changed, and the sampled voltage signal is passed through the digital integrator with the adjusted filter coefficients. The new peak value of the digital integrator's output is then measured. As in fixed sampling frequency systems, the computed V/Hz value is compared with predetermined settings to generate the relay signals.

The technique of the invention can be used in a digital system using either a fixed sampling frequency or a variable sampling frequency. Preferably, if the sampling frequency is variable, the filter coefficients of the digital integrator are recalculated each time the sampling frequency is changed, where at least one of the filter coefficients is less than one so that the digital integrator is stable.

BRIEF DESCRIPTION OF THE DRAWINGS

The objects and advantages of the invention will become more apparent and more readily appreciated from the following detailed description of presently preferred exemplary embodiments of the invention taken in conjunction with the accompanying drawings, of which.

DETAILED DESCRIPTION OF PRESENTLY PREFERRED EMBODIMENTS

A digital integrator V/Hz relay with the above-mentioned beneficial features in accordance with a presently preferred exemplary embodiment of the invention will be described below with reference to FIGS. 3–9. It will be appreciated by those of ordinary skill in the art that the description given herein with respect to those figures is for exemplary purposes only and is not intended in any way to limit the scope of the invention. All questions regarding the scope of the invention may be resolved by referring to the appended claims.

Figure 3:
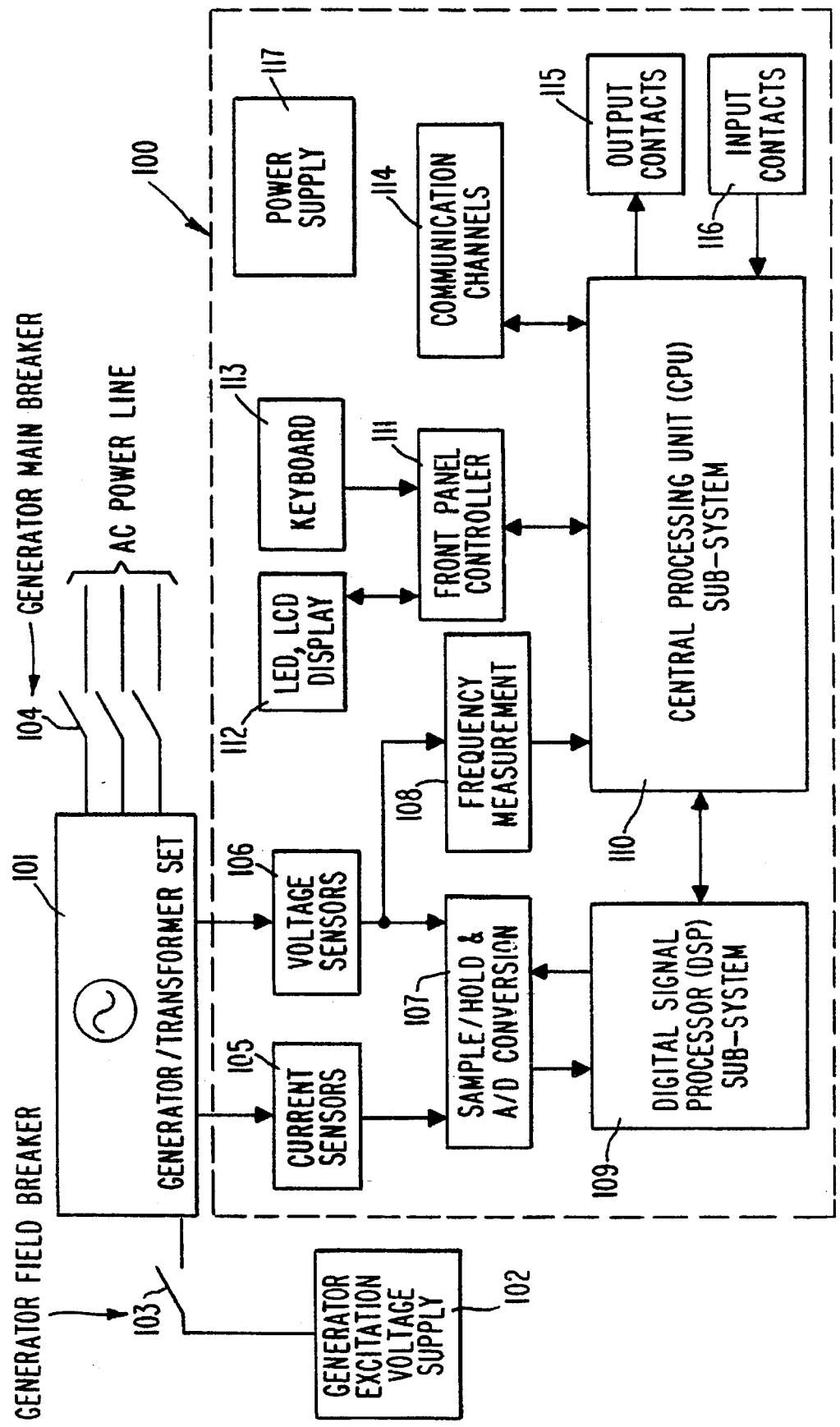
FIG. 3 illustrates a multi-function digital generator protection unit for measuring an overexcitation condition of a generator or transformer in accordance with the techniques of the invention.

As shown in FIG. 3, the present invention is preferably, though not necessarily, implemented in a system containing a multi-function digital generator protection unit (GPU) 100 which is designed to protect a generator/step-up transformer set 101 in accordance with the invention. As known by those skilled in the art, GPU 100 controls the main breaker 104 to connect and disconnect generator/transformer set 101 to/from the main AC system. GPU 100 may also control the field breaker 103 to connect and disconnect the generator excitation voltage supply 102 to/from the generator field winding of the generator/transformer set 101. In short, GPU 100 detects those conditions requiring control, alarm and shut down of an associated generator/transformer, and upon detection of an overexcitation condition of the associated generator, an instant or delayed trip of the generator field circuit breaker and/or main circuit breaker is initiated via external interfaces of GPU 100.

The GPU 100 functions by converting the three phase currents and voltages of the generator/transformer set 101 from the actual signals to appropriate current and voltage signals using current sensors 105 and voltage sensors 106, respectively. The output signals of current sensors 105 and voltage sensors 106 are then sampled using a predetermined sampling frequency approach (fixed or variable) and converted from analog to discrete digital signals by sample/hold & A/D conversion sub-system 107. The voltage signals are also used by the frequency measurement circuit 108 to measure the fundamental frequency of the voltage using known methods.

For example, the frequency may be measured in the frequency measurement circuit 108 by first filtering the input voltage signal using an analog bandpass or lowpass filter. The cutoff frequency could be set equal to the fundamental frequency of the voltage signal to filter out noises and harmonics. The sinusoidal output signal of the filter is then converted into a square waveform and the width of the square waveform is measured by a high frequency pulse using a digital counter and read into the DSP sub-system 109. The fundamental period T (=1/f) can be computed from the number of pulses counted in one cycle and the pulse length of the high frequency pulse. The measured frequency is then used for frequency related protection functions, such as over-frequency and under-frequency excitation protection, and may also be used in accordance with the invention to compensate nonlinear frequency response characteristics of the voltage sensors 106 and/or the non-ideal characteristics of the digital integrator of the invention applying well known table look-up or curve-fitting methods.

Voltage sensors 106 may have a nonlinear voltage transfer ratio over the desired V/Hz frequency range, which causes additional errors in the V/Hz relay determination. Accordingly, the ratio-frequency characteristic of a particular voltage sensor can be measured and stored in the relay in accordance with the invention for correcting the errors caused by the voltage sensors 106.

The digitized and sampled data are processed in Digital Signal Processor (DSP) sub-system 109 to generate DFT phasors, RMS values, V/Hz values, and the like of the sampled signals for use by different protection functions implemented in software on Central Processing Unit (CPU) sub-system 110. The CPU sub-system 110 further interfaces with a front panel controller 111 to display data and waveforms on LED and LCD display 112 and to read data from keyboard 113 and with communication channels 114 to communicate with local and remote computers for data exchange. The CPU sub-system 110 may also interface with output contacts 115 to send out alarm signals and trip signals to trip breakers such as breakers 103 and 104 and with input contacts 116 to obtain additional information used by some protection functions of the CPU sub-system 110. All components of GPU 100 receive their power supply from power supply 117.

The software of GPU 100 is divided into three parts: one for the DSP sub-system 109, one for the CPU sub-system 110, and one for the front panel controller 111. Since the software for the front panel controller 111 performs conventional functions such as inputting settings, displaying results, and the like, it will not be described in detail. The functioning of the portions of the DSP software and CPU software related to the V/Hz relaying function will now be described with respect to FIGS. 4 and 5.

The DSP software implemented on DSP sub-system 109 controls sample/hold & A/D conversion circuit 107 and processes the sampled data to generate DFT phasors, RMS values, V/Hz values, and the like for use by the protection functions of the CPU sub-system 110. In accordance with the invention, the processing of the sampled data is performed each time that new samples of voltages and currents are obtained during each sampling interval.

Figure 4B:
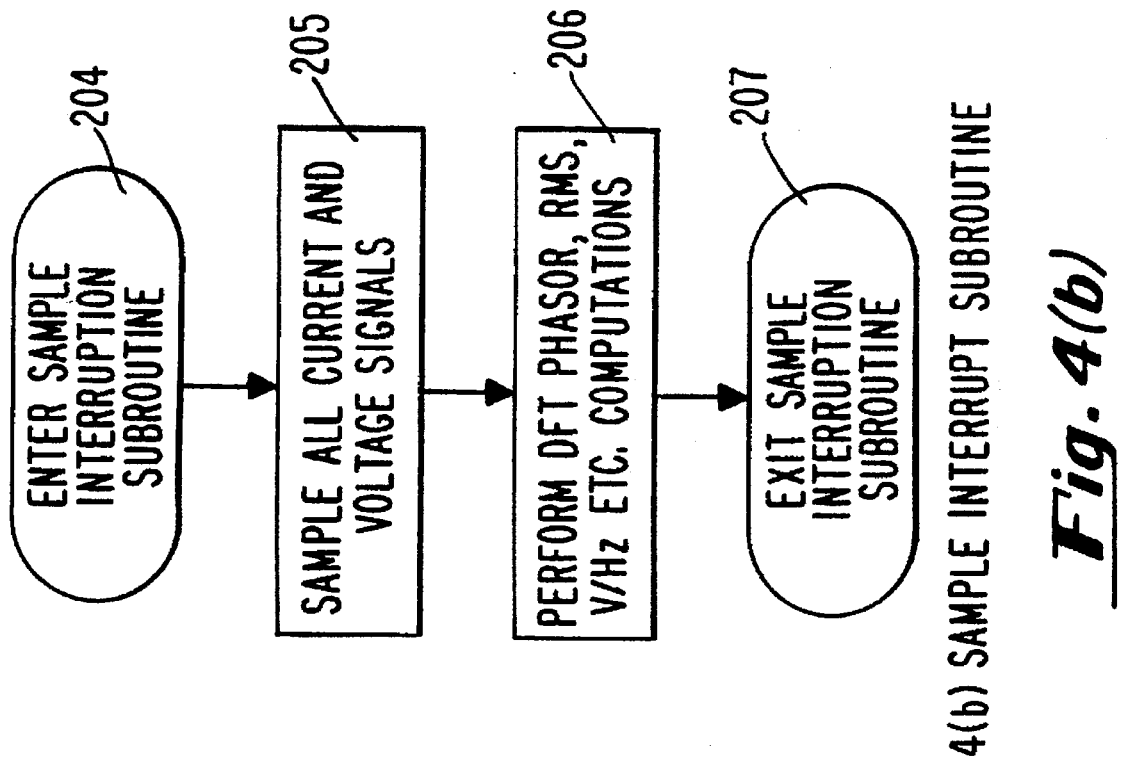
FIGS. 4A and 4B respectively illustrate the main and sample interrupt software routines implemented on a processor of the DSP sub-system 109.
Figure 4A:
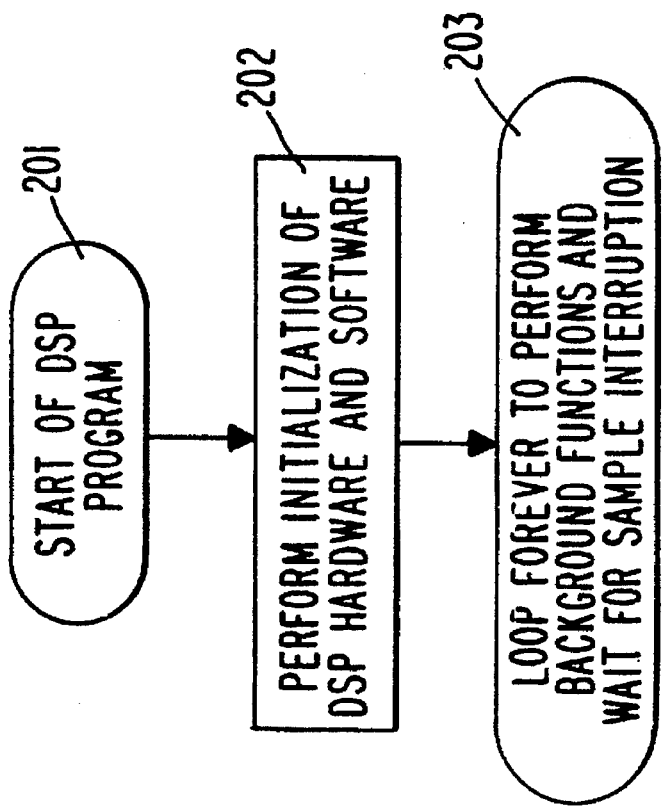
Figure 4C:
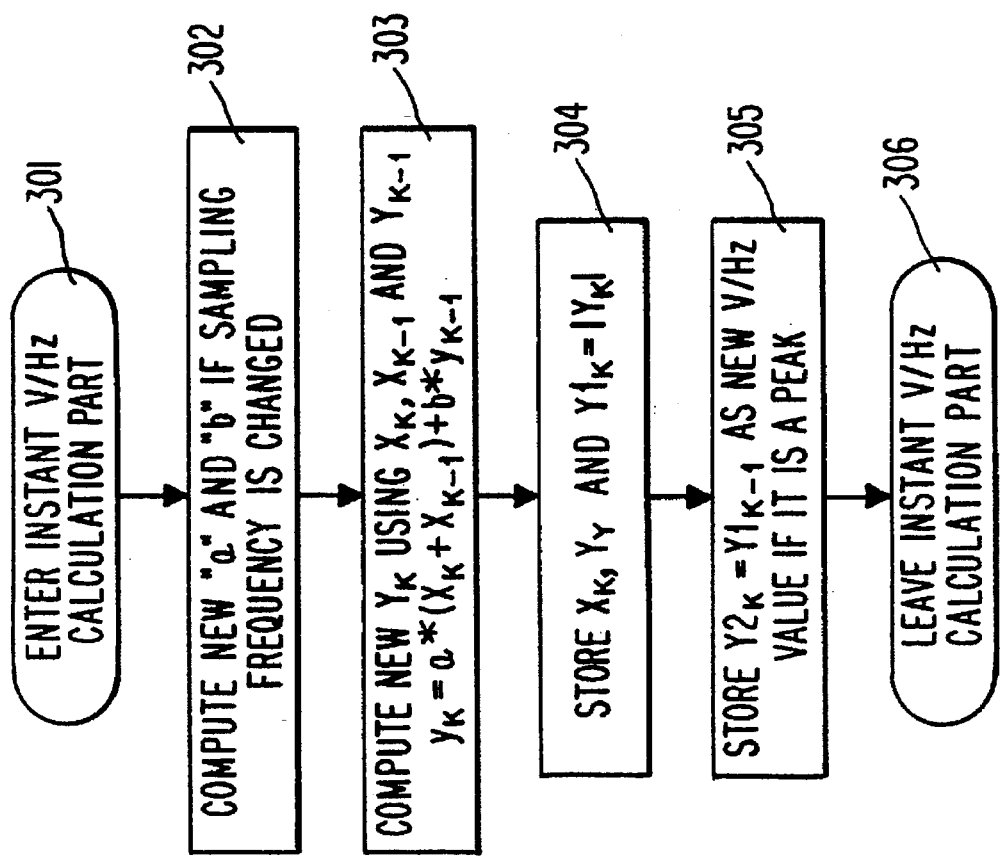
FIG. 4C is a flow chart illustrating the V/Hz value computation by the DSP software in accordance with the techniques of the invention.
Figure 4D:
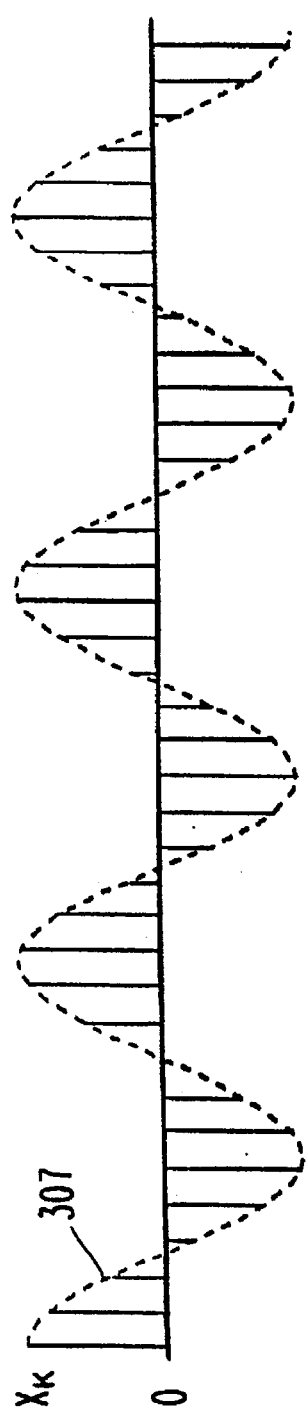
FIGS. 4D–4G illustrate the signals generated at different stages of the digital integration V/Hz value calculation in accordance with the invention.
Figure 4E:
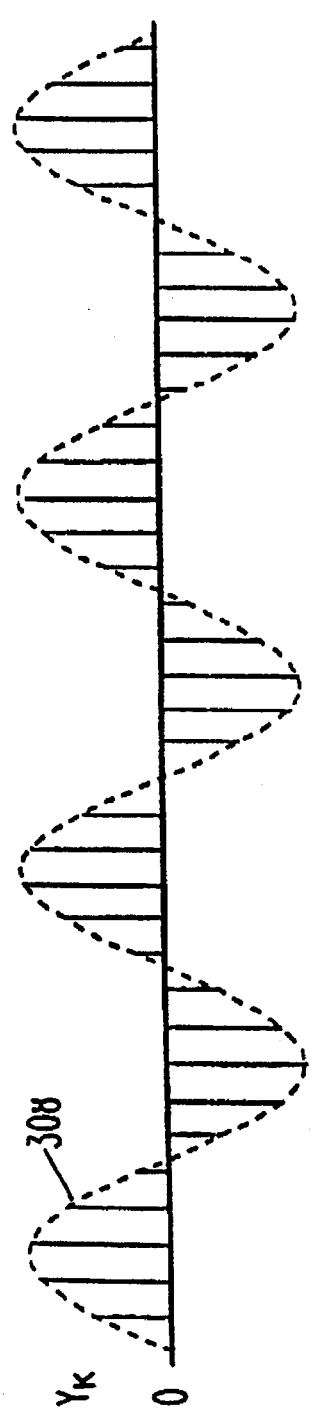
Figure 4F:
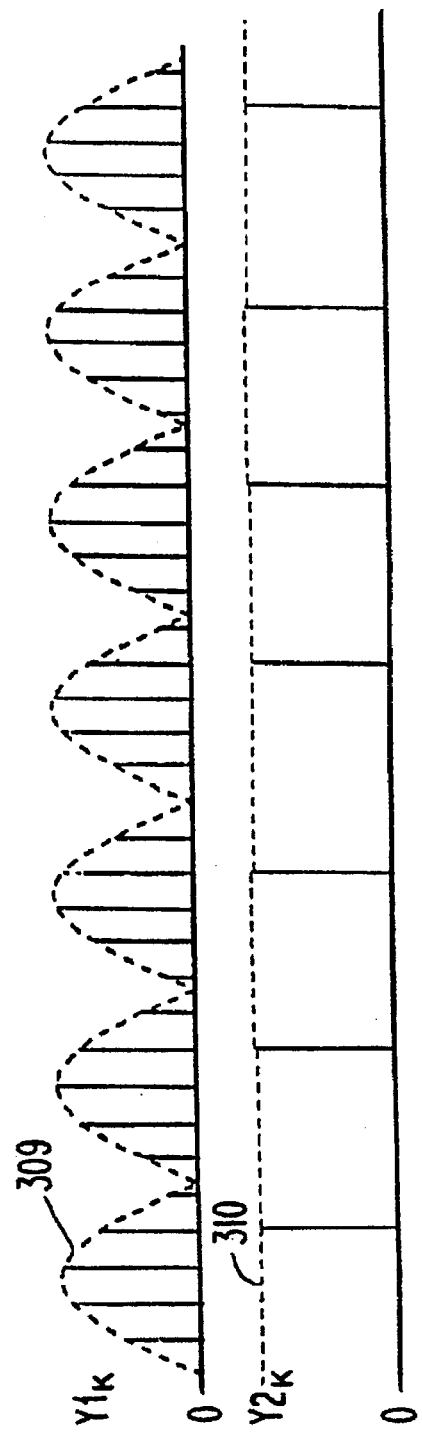
Figure 4G:
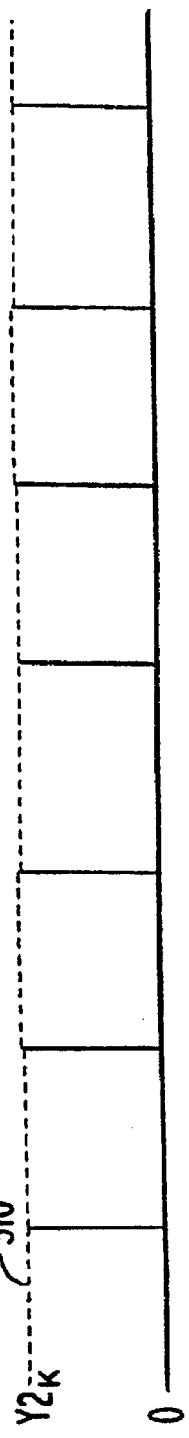

FIGS. 4A and 4B show the overall DSP sub-system software flow chart, while FIG. 4C shows the flow chart related to V/Hz value computation in step 206 of the DSP software shown in FIG. 4B. As illustrated in FIG. 4A, the DSP program starts at step 201 and performs initializations of the DSP hardware of DSP sub-system 109 and the DSP software on a processor of DSP sub-system 109 at step 202. The main program of FIG. 4A loops forever at step 203 to perform the background functions until a sample interrupt is received. Then, when a sample interrupt is received, the subroutine of FIG. 4B is entered at step 204. Upon entry of the sample interruption subroutine, the current and voltage signals from current sensors 105 and voltage sensors 106 are sampled by sample/hold & A/D conversion circuit 107 at step 205. The DFT phasors, RMS values, V/Hz computations and the like are then performed at step 206 before the sample interruption subroutine is exited at step 207. The computation of the DFT phasor and the RMS values do not form part of the invention and may be computed using conventional DFT techniques. Calculation of the V/Hz values in accordance with a preferred embodiment of the invention will now be described with respect to FIG. 4C.

As shown in FIG. 4C, the V/Hz value computation is performed in the DSP software by entering the V/Hz calculation program at step 301. In order to perform the new V/Hz value computation in accordance with the invention, the sampling period $\Delta t$ ($=1/f_{smp}$, where $f_{smp}$ is the sampling frequency), the new voltage sample $x_k$, and the new frequency "f" measured by the frequency measurement circuit 108 are read in at step 301. The new values of the filter coefficients "a" and "b" are computed at step 302 using $\Delta t$ (described in more detail below) if the sampling frequency has changed. Thus, unlike prior art systems which require the sampling frequency to remain constant, the present invention accommodates dynamic sampling frequency changes by recalculating the filter coefficients "a" and "b" at each sampling interval. A new output value $y_k$ is then calculated at step 303 using the digital integration techniques of the invention (described in more detail below), and the new voltage sample $x_k$ and the resulting values $y_k$ and $y1_k$ ($=|y_k|$) are stored at step 304 for use by the process in the next sampling interval by the CPU software. The frequency compensation for the voltage sensors 106 and the digital integrator may be performed at step 304 on $y1_k$ before it is stored. Then, at step 305, $y2_k$ ($=|y1_{k-1}|$) is stored as a new V/Hz value if it is a peak. The V/Hz calculation program is then exited at step 306.

FIGS. 4D–4G show the signals at each processing stage. Signal 307 is the sampled input voltage signal, which corresponds to $x_k$ in step 303 of FIG. 4C and could be sampled at either a fixed frequency or a varying frequency. Signal 308 is the output $y_k$ of the digital integrator in step 303 of FIG. 4C, which still has a sinusoidal envelope. Signal 308 is $y1_k$ obtained in step 304 in FIG. 4C, which is the rectified digital integrator output $y_k$. Signal 310 ($y2_k$ in step 305 of FIG. 4C) is the V/Hz value computed by detecting the peak value of signal 309. As will be described below, signal 309 ($y1_k$) is then used in step 503 of FIG. 5C for instant trip determination, and the signal 310 ($y2_k$) is used in step 505 of FIG. 5C for computing the time-to-trip if it exceeds the pick-up level.

The CPU software, on the other hand, controls the communication channels 114 and output contacts 115, reads the status of the input contacts 116, performs all designed protection functions for the generator/transformer set 101, and, at the same time, the CPU software interfaces with the front panel controller 111 to read data from the keyboard 113 and to display data and waveforms on the front panel's LEDs and LCDs. A simplified flow chart of the CPU sub-system software is shown in FIG. 5A and 5B, and the related flow chart for the V/Hz relay function (block 405 in FIG. 5B) is shown in FIG. 5C.

Figure 5B:
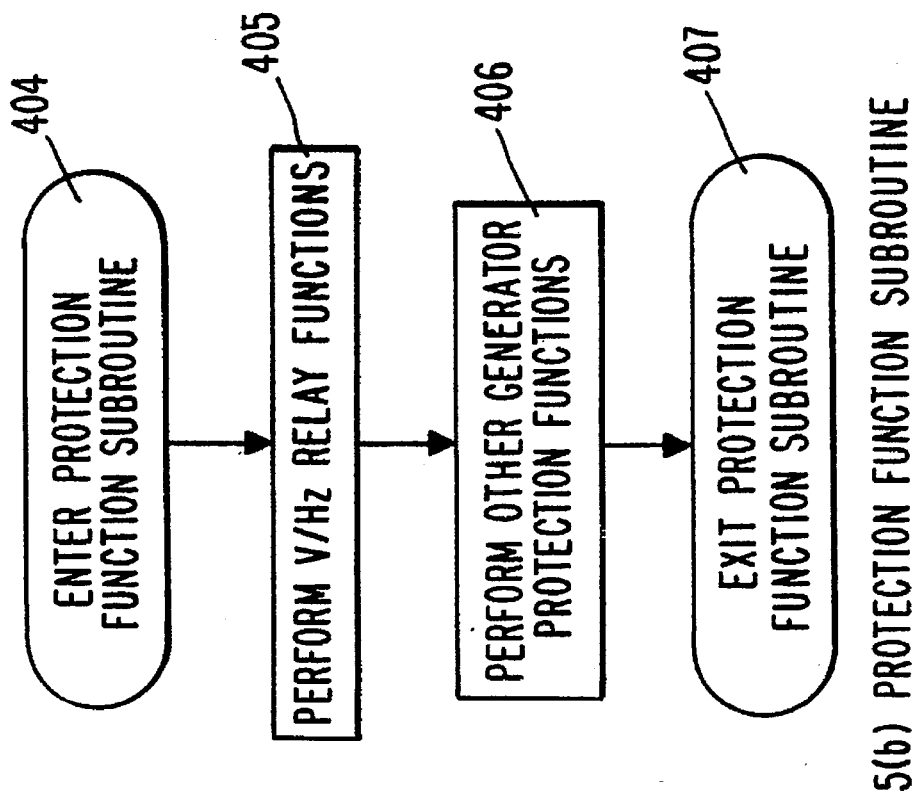
FIGS. 5A and 5B respectively illustrate the main and protection function software routines implemented on a processor of the CPU sub-system 110.
Figure 5A:
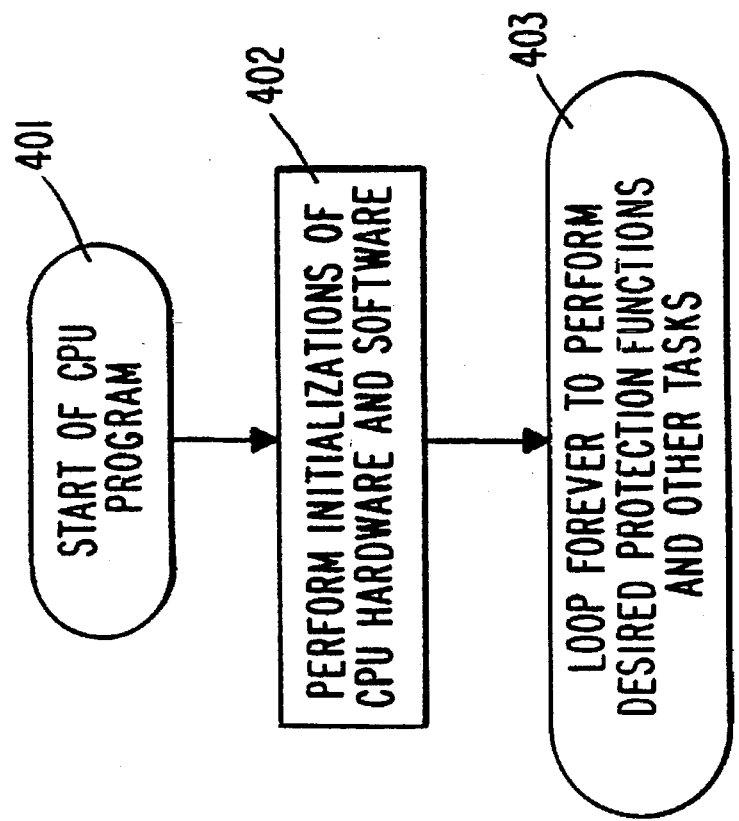

As illustrated in FIG. 5A, the CPU program starts at step 401 and performs initializations of the CPU hardware of CPU sub-system 110 and the CPU software on a processor of CPU sub-system 110 at step 402. The main program of FIG. 5A loops forever at step 403 to perform designated protection functions as well as other tasks. When a protection function is to be performed, the protective function subroutine of FIG. 5B is entered at step 404. The V/Hz relay functions are performed at step 405 in a conventional manner in dependence upon the V/Hz values calculated in the DSP sub-system software (FIG. 4C). For example, a "trip" signal may be sent to breakers 103 and/or 104 if an overexcitation condition is detected. Other generator/transformer set 101 protection functions are then performed at step 406 before the protection function subroutine is exited at step 407.

Figure 5C:
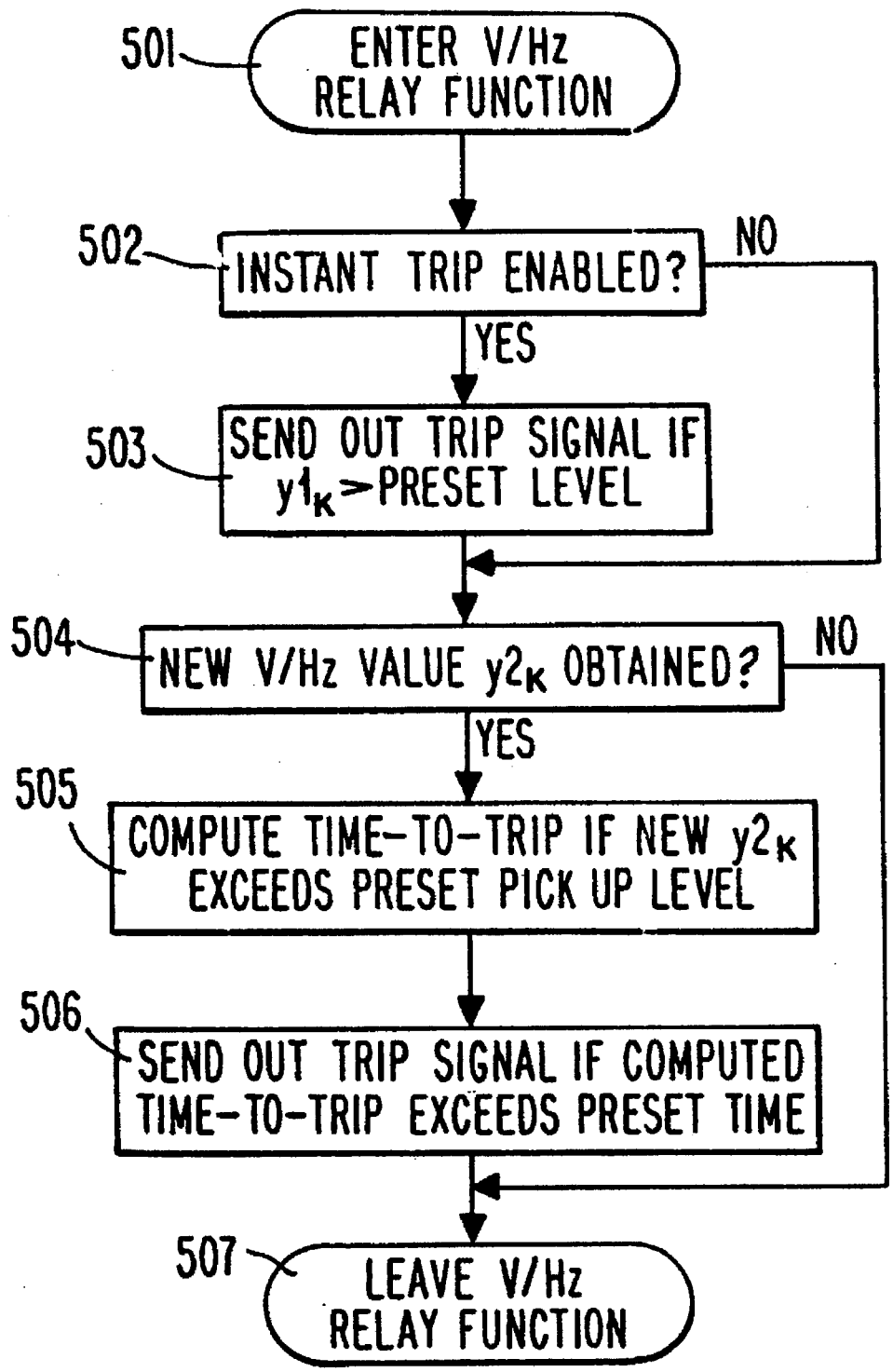
FIG. 5C is a flow chart illustrating the instant trip and delayed trip time calculations using the V/Hz values calculated in accordance with the techniques of the invention.

Each time the protection function subroutine of FIG. 5B is executed, the V/Hz relay function of step 405 is entered at step 501 (FIG. 5C) to check to see if the instant $y1_k$ value from the DSP sub-system 109 (signal 309 of FIG. 4F) exceeds the preset instant trip level when the instant trip of V/Hz is enabled (blocks 502 and 503 of FIG. 5C). A trip signal will be generated at step 503 immediately if the preset level is exceeded. For a V/Hz relay delayed trip function, on the other hand, the system operates according to the selected generator/transformer capability curve in accordance with known techniques. In other words, if it is determined at step 504 that a new V/Hz value $y2_k$ is obtained (signal 310 of FIG. 4G), then the time-to-trip (either fixed or inverse time delay) is computed at step 505 when the new $y2_k$ value exceeds the preset pick up level. If the pick up level is exceeded, the inverse time trip signal is then sent out at step 506 at the end of the time delay. The time to trip is then reset based on the cooling factor of the generator/transformer set 101, and the V/Hz relay function is exited at step 507.

As noted above, the present invention is primarily directed to a new method of implementing accurate V/Hz value measurement and trip time determination for generator/transformer overexcitation protection in a manner which is independent of the conventional frequency tracking and phasor estimation based on Discrete Fourier Transformation (DFT) techniques in a multi-function GPU 100 of the type described above with respect to FIGS. 3–5. The present invention uses the same sampled data as are used by the DFT technique for other functions, but does not use any phasor estimation results of the DFT technique. Instead, the V/Hz ratio is computed directly from the sampled voltage data using the techniques described below. The result is overall better performance for the digital GPU system.

In particular, the V/Hz ratio is computed in accordance with the invention by passing the sampled voltage signal through a digital integrator and measuring the magnitude of the digital integrator's output. Preferably, the digital integrator is implemented in the DSP software (FIG. 4C) of DSP sub-system 109 in place of the conventional algorithm for tracking the frequency and estimating the voltage phasors. The technique of the invention avoids the computation of voltage magnitude and obtains an accurate V/Hz ratio directly from the sampled voltage data. As will be appreciated by those skilled in the art, this technique can be used in a digital system using either a fixed or a variable sampling frequency.

The Digital Integrator type V/Hz relaying techniques in accordance with the invention obtain the ratio of V/Hz of a sinusoidal input signal directly. The Digital Integrator type V/Hz relaying techniques of the invention are based on the integration of an input sinusoidal signal $x = B \sin(2\pi f t)$ (where f is the frequency of x, B is the amplitude, and t is time):

$$y = \int x \, dt = \int B \sin(2\pi f t) dt = -\frac{B}{2\pi f} \cos(2\pi f t) \qquad \text{Equation (4)}$$

As can be seen from the above equation, the magnitude of the integrated output signal y is inversely proportional to the frequency of the input signal x. Thus, the peak value of the integrated signal can be used to obtain the required V/Hz ratio.

Figure 1:
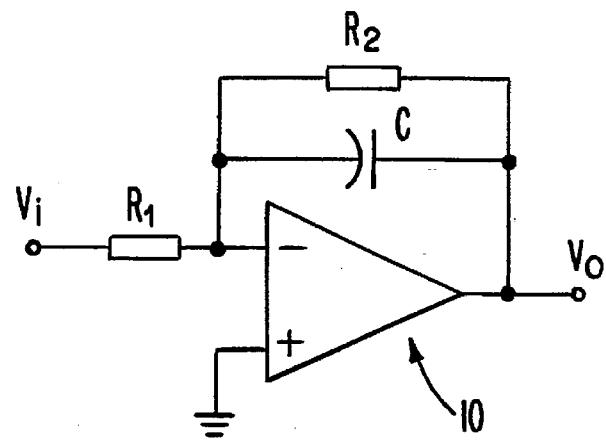
FIG. 1 illustrates a conventional analog integrator circuit.

The Digital Integrator type V/Hz relaying technique in accordance with the invention is designed using a difference equation mapping method, that is, the analog integrator 10 shown in FIG. 1 is implemented in a digital system in accordance with the invention as a difference equation. As will become apparent from the following detailed description, the design method of the present invention provides a direct link between the coefficients of the digital integrator and the sampling period as well as the parameters A and p of the familiar analog integrator's transfer function $H(s) = A/(s-p)$, which offers several advantages to the digital integrator type V/Hz relaying techniques as will be described in more detail below.

The differential equation for the analog integrator of FIG. 1 is:

$$C \frac{dV_o(t)}{dt} = \frac{V_i(t)}{R_1} - \frac{V_o(t)}{R_2} \qquad \text{Equation (5)}$$

If x=Vi(t) and y=Vo(t), then $$C \frac{dy}{dt} = \frac{x}{R_1} - \frac{y}{R_2} \quad \text{Equation (6)}$$

Equation 6 can be rewritten as:

$$\frac{dy}{dt} = \frac{1}{CR_1} x - \frac{1}{CR_2} y = -Ax + py \quad \text{Equation (6a)}$$

where $A = -\frac{1}{CR_1}$ and $p = -\frac{1}{CR_2}$ (<0).

Equation 6a can be differentiated in different ways to provide a Digital Integrator type V/Hz relaying technique in accordance with the invention. For example:

1. Simple voltage difference ("Running Sum" Digital Integrator V/Hz relaying technique):

$$\frac{y_k - y_{k-1}}{\Delta t} = -Ax_k + py_k \quad \text{Equation (7)}$$

where $\Delta t$ is the sampling period (=$1/f_{smp}$, where $f_{smp}$ is the sampling frequency), which leads to $$y_k = ax_k + by_{k-1} \quad \text{Equation (8)}$$

where $$a = \frac{-A\Delta t}{1 - p\Delta t}, \quad b = \frac{1}{1 - p\Delta t} < 1 \quad \text{Equation (9)}$$

2. Center difference ("Trapezoid Rule" Digital Integrator V/Hz relaying technique):

$$\frac{y_k - y_{k-1}}{\Delta t} = -A \frac{x_k + x_{k-1}}{2} + p \frac{y_k + y_{k-1}}{2} \quad \text{Equation (10)}$$

where $\Delta t$ is the sampling period (=$1/f_{smp}$, where $f_{smp}$ is the sampling frequency), which leads to $$y_k = a(x_k + x_{k-1}) + by_{k-1} \quad \text{Equation (11)}$$

where $$a = \frac{-A\Delta t}{2 - p\Delta t}, \quad b = \frac{2 + p\Delta t}{2 - p\Delta t} < 1 \quad \text{Equation (12)}$$

Figure 2A:
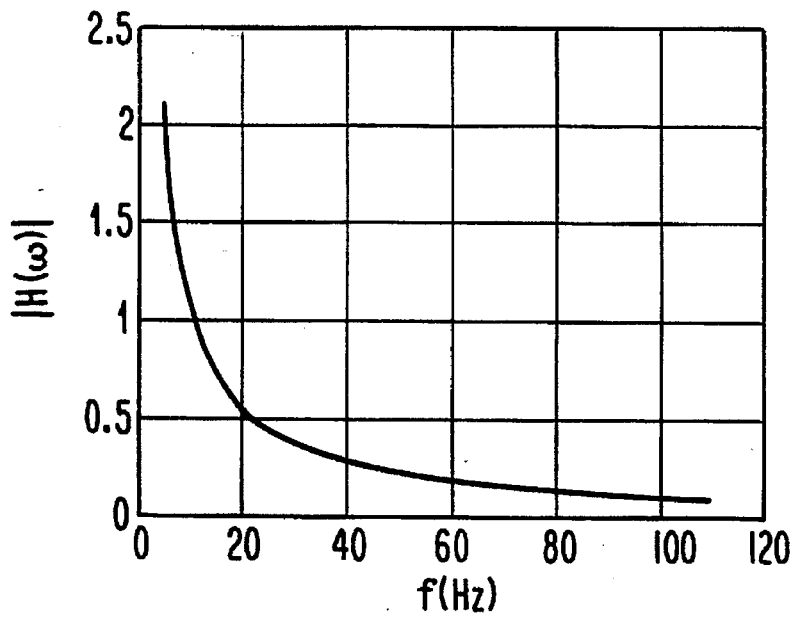
FIGS. 2A and 2B together illustrate a comparison of the frequency response curves between an ideal and an actual analog integrator circuit of the type illustrated in FIG. 1.
Figure 2B:
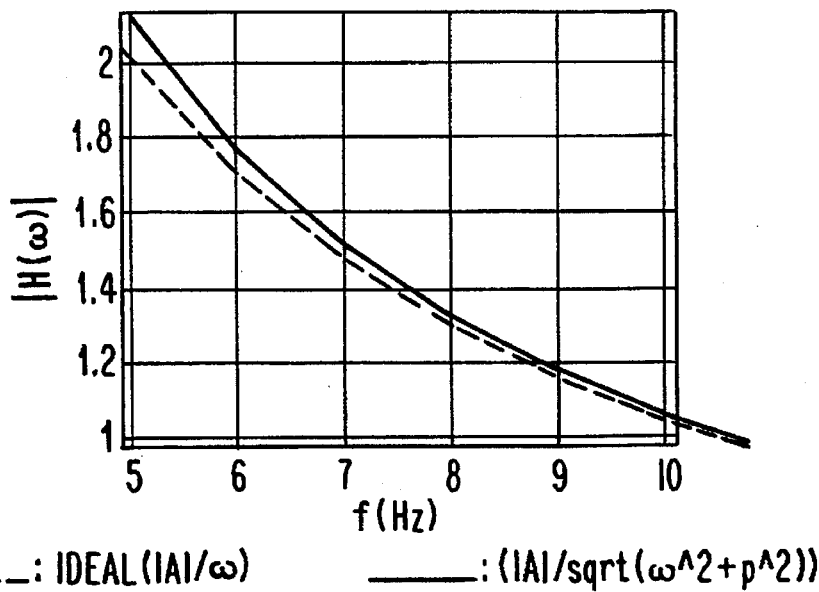
Figure 2C:
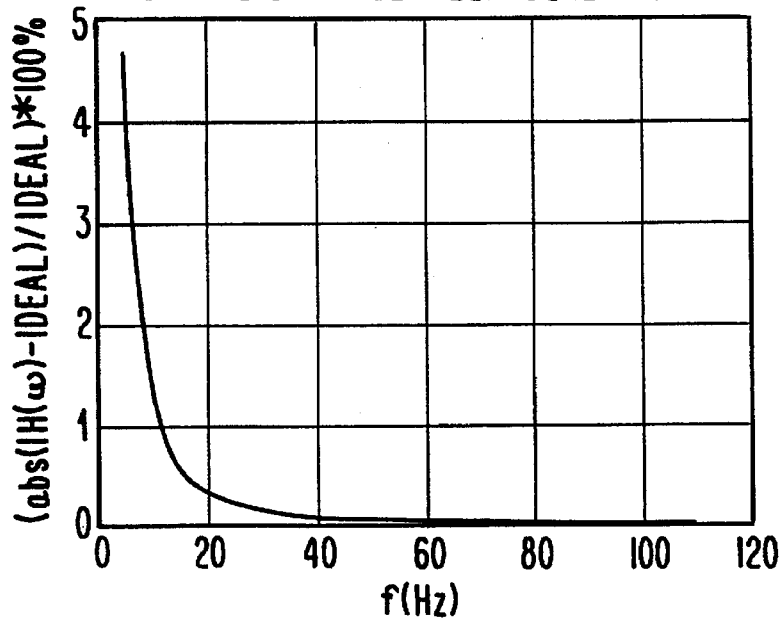
FIG. 2C illustrates the relative error between an actual analog integrator circuit and an ideal integrator circuit of the type illustrated in FIG. 1.
Figure 6A:
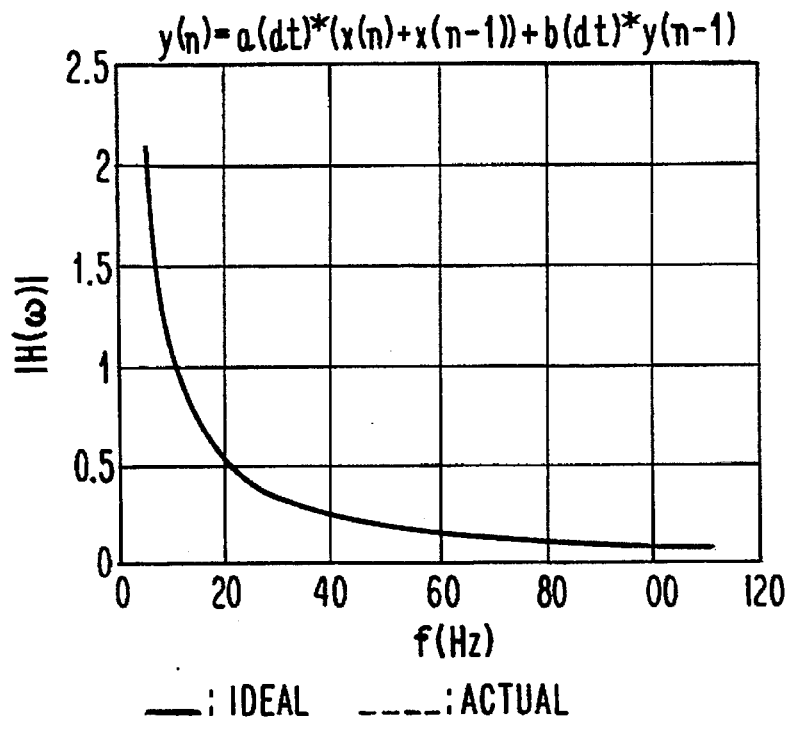
FIGS. 6A and 6B illustrate the frequency response of the digital integrator of the invention.
Figure 6B:
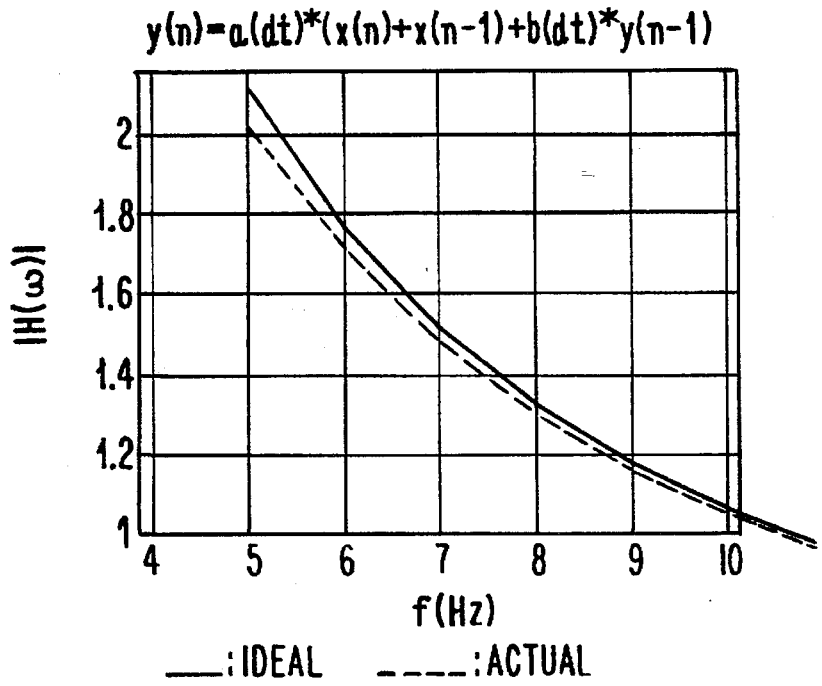

Those skilled in the art will appreciate that the Digital Integrator type V/Hz relaying techniques just described are recursive type digital algorithms which may be preferably implemented as software on a processor of the DSP subsystem 109 of GPU 100. Those skilled in the art will also appreciate that the coefficient "b" of the algorithm must be less than 1 in order for the algorithm to be stable. One of the advantages of the above design method in accordance with the invention is that the stability of the algorithm is ensured if a "p" less than zero (as with the stable analog integrator) is used. Since the parameter "p" of the transfer function H(s)=A/(s-p) also determines the frequency response characteristic and the transient response time, those skilled in the art will appreciate that, using Equations (9) or (12), a digital integrator can be easily designed to have the desired frequency response characteristic and transient response time. The frequency response of a resulting digital integrator using the same "A" and "p" values of the exemplary analog integrator is illustrated in FIGS. 6A and 6B, which are quite similar to the corresponding curves in FIGS. 2A and 2B for the analog integrator 10 of FIG. 1.

In addition to the digital integrator, it will be appreciated by those skilled in the art that a peak detector is needed to determine the peak of the sinusoidal output of the digital integrator each half cycle. Those skilled in the art will also appreciate that when a peak detector is implemented in a digital system, the Digital Integrator type V/Hz relaying techniques described herein will have a "peak-miss" error in detecting the actual peak of the integrated signal. The "peak-miss" error is caused by the fact that the actual peak of the integrated signal may appear in between two discrete sample points. The maximum error will occur when the actual peak is at the mid-point of two output points $y_k$ and $y_{k-1}$. Assuming the sampling frequency is "$f_{smp}$", and the input signal's frequency is "f", then the maximum "peak-miss" error will be:

$$e_{max} = 1 - \sin\left(\frac{\pi}{2}\left(1 - \frac{f}{2f_{smp}}\right)\right) \quad \text{Equation (13)}$$

Figure 7:
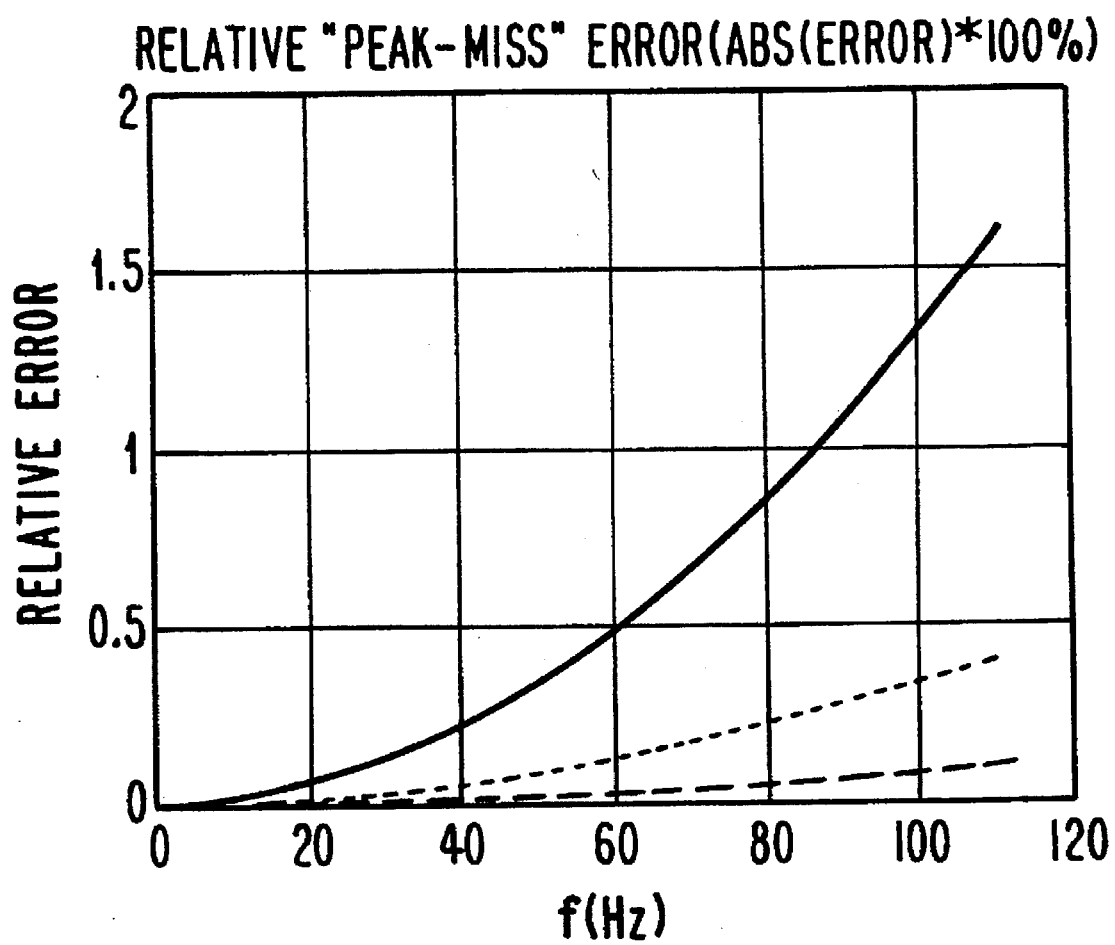
FIG. 7 illustrates the "peak-miss" error at different sampling frequencies for the desired frequency range of the digital integrator of the invention.

The "peak-miss" error at different sampling frequencies for the desired V/Hz frequency range is shown in FIG. 7. Analysis of Equation 13 shows that a sampling frequency higher than 1920 Hz for the fixed sampling frequency approach or 24 samples/cycle for the varying sampling frequency approach will be sufficient to reduce this error to below 0.1% across the desired V/Hz frequency range (5–80 Hz).

As will be appreciated by those skilled in the art, the most important advantage of the invention is that the coefficients of the digital integrators designed in accordance with the invention are directly linked to the sampling period (or sampling frequency) of the digital system. As a result, the technique of the invention can be used either for a fixed sampling frequency approach or for a variable sampling frequency approach. If the variable sampling approach is used, the coefficients of the digital integrators of the invention can be computed every time the sampling frequency is updated to maintain the desired frequency response characteristic.

The technique of the invention thus provides for improved V/Hz relaying using digital integration techniques in an otherwise DFT based multi-function relay system. In other words, the present inventors recognize that the DFT technique may be suitable for most of the generator protection functions when a variable sampling frequency technique plus fixed DFT window technique is used or a fixed sampling frequency technique plus varying DFT window technique is applied, for most of generator protection functions are only required to operate around the rated frequency (60 Hz in North America). For both techniques, their covered frequency range is determined by the anti-aliasing limitation at the low frequency end and the computation power limitation at the high frequency end. Unlike in a stand-alone protection system where the system hardware and the software can be designed to meet the specific requirements of a particular function, the sampling frequency approach (either varying or fixed) and/or the DFT technique used in such a system is usually determined by the overall system requirements but not an individual function. However, since the frequency range provided by the DFT technique does not meet the V/Hz relay's requirements, the present invention is very useful in providing adequate V/Hz relaying in a DFT technique based multi-function generator protection system.

Figure 8:
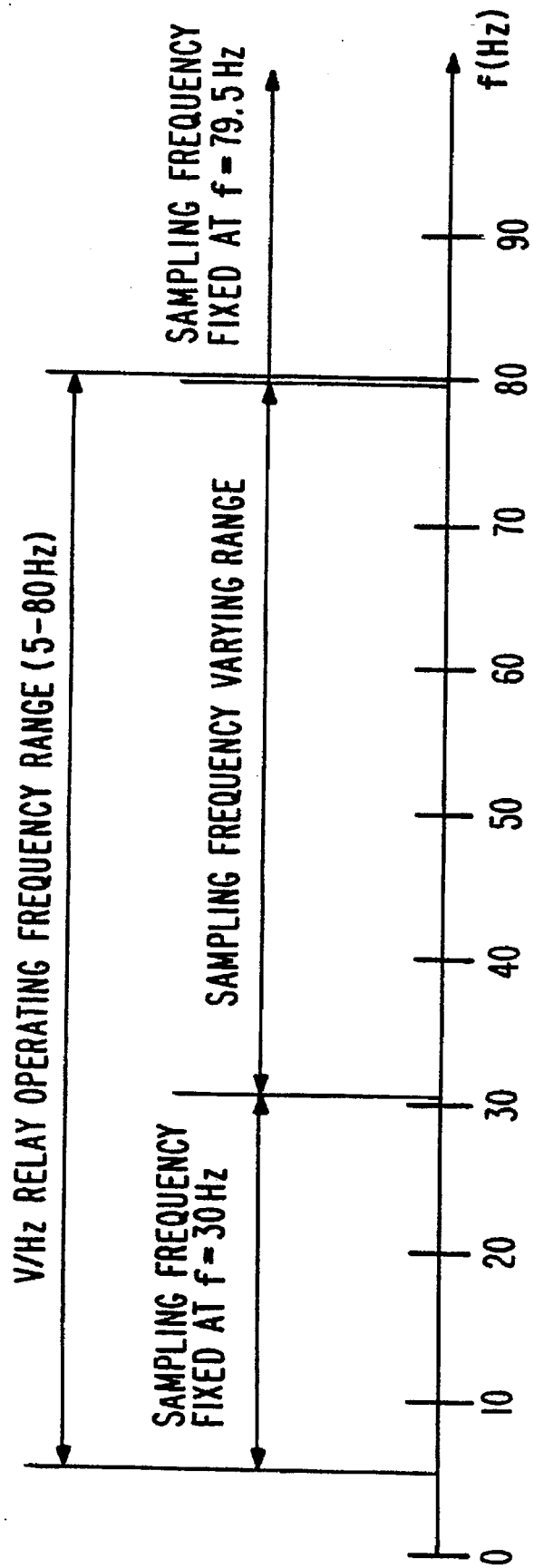
FIG. 8 illustrates a frequency range comparison between the varying sampling frequency approach used in a conventional relay (30.5–79.5 Hz) and the V/Hz relay of the invention (5–80 Hz).
Figure 9:
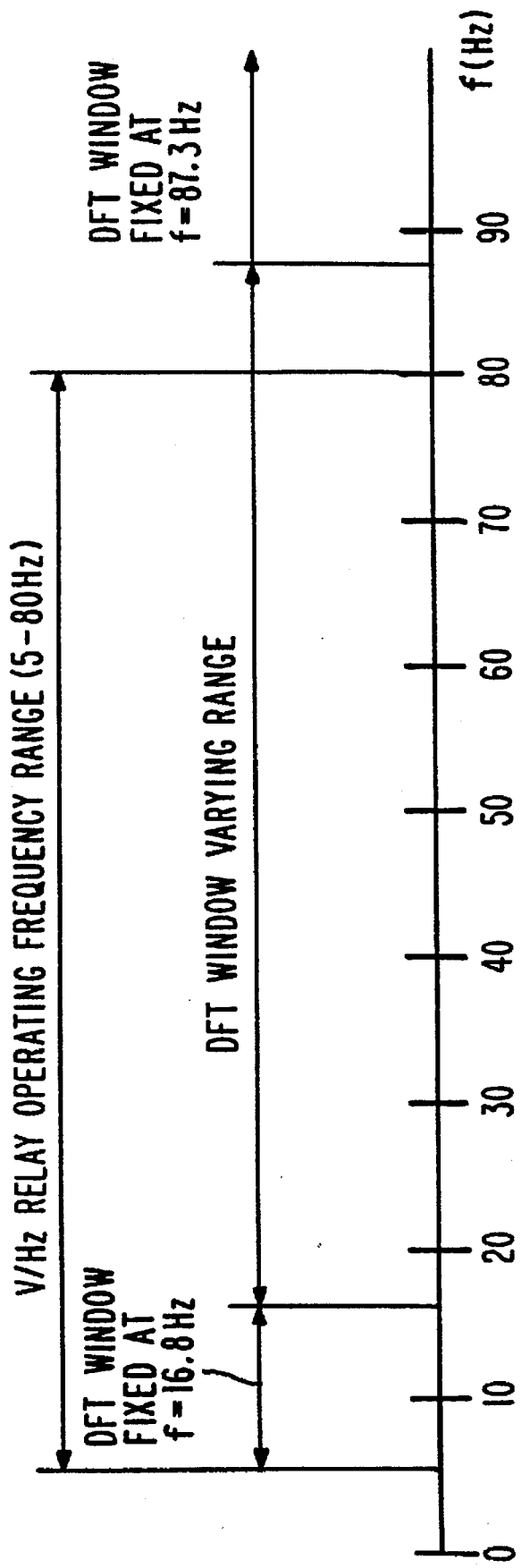
FIG. 9 illustrates a frequency range comparison between a varying DFT window technique (16.8–87.3 Hz) and the V/Hz relay of the invention (5–80 Hz).

FIG. 8 illustrates a frequency range comparison between the varying sampling frequency approach used in a conventional General Electric relay (30.5–79.5 Hz) and the V/Hz relay of the invention (5–80 Hz), while FIG. 9 illustrates a frequency range comparison between a varying DFT window technique (16.8–87.3 Hz) and the V/Hz relay of the invention (5–80 Hz).

Thus, the main advantages of the Digital Integrator type V/Hz relaying technique in accordance with the invention are: (1) The Digital Integrator type V/Hz relaying technique can be easily designed to have the desired frequency response characteristic and the desired transient response delay time. (2) High accuracy across the desired V/Hz relaying frequency range (5–80 Hz) is obtainable. (Indeed, the relative error for the example is less than 0.5% for the frequency range 20–80 Hz, and is less than 4% in the frequency range of 5–20 Hz when p=−10 is used.) (3) Digital Integrator type V/Hz relaying can be used either for a fixed sampling frequency or for a varying sampling frequency digital protection system. (When the varying sampling frequency approach is used, the coefficients "a" and "b" can be recomputed on-line every time the sampling frequency is changed. In a fixed sampling frequency approach, on the other hand, both "a" and "b" are constants.) (4) The design method described herein ensures that the Digital Integrator is always stable. (5) A Digital Integrator is easy to implement in a digital protection system.

Although exemplary embodiments of the invention have been described in detail above, those skilled in the art will readily appreciate that many additional modifications are possible in the exemplary embodiment without materially departing from the novel teachings and advantages of the invention. For example, those skilled in the art will appreciate that the digital integrator type V/Hz technique of the invention may still contain errors across the whole desired frequency range because a non-ideal integrator is used (the ideal integrator is unstable). However, this error can be easily compensated by storing the error-frequency characteristic of a particular integrator in the relay and using such values and the measured frequency to compensate for such non-ideal characteristics of the digital integrator. The frequency compensation of voltage sensor error and integrator error also can be combined together to reduce the burden of the microprocessor. Accordingly, all such modifications are intended to be included within the scope of this invention as defined in the following claims.

What we claim is:

1. A programmed protective relay system for protecting power equipment, supplied with energy from at least one power line, against overexcitation by generating an overexcitation relay signal and providing said relay signal to a circuit breaker which separates said power equipment from a source of said overexcitation, said system comprising:

a voltage sensor for sensing a voltage of said at least one power line;

frequency determining means for determining a frequency of said sensed voltage of said at least one power line;

analog to digital conversion means for sampling and digitizing said sensed voltage at a sampling frequency so as to form a digital voltage signal;

a digital integrator which integrates said digital voltage signal in a manner independent of said sampling frequency; and processing means for calculating a voltage/frequency ratio of said at least one power line from a peak magnitude of an output of said digital integrator and said frequency determined by said frequency determining means and for generating said relay signal when said voltage/frequency ratio exceeds a predetermined operating condition value.

2. A system as in claim 1, wherein said processing means includes a peak detector which detects said peak magnitude of said output $y_k$ of said digital integrator from said digital voltage signal $x_k$, where $x_k$ is a digitized sample of an input voltage signal B sin(2πft), where B is an amplitude of said input voltage signal, f is the frequency of said input voltage signal, and t is time.

3. A system as in claim 2, wherein said digital integrator comprises a digital filter with a response characteristic determined using a difference equation mapping method from an analog integrator having a frequency response function $H(j\omega)=A/(j\omega-p)$, where $\omega=2\pi f$, f is frequency, A is a scale factor, and p <0.

4. A system as in claim 3, wherein said digital filter has a difference equation $y_k = ax_k + by_{k-1}$ for input samples $x_k$ and output samples $y_k$ and $$a = \frac{-A\Delta t}{1-p\Delta t}, \quad b = \frac{1}{1-p\Delta t} < 1$$

where $\Delta t$ is a sampling period of said analog to digital conversion means.

5. A system as in claim 3, wherein said digital filter has a difference equation $y_k = a(x_k + x_{k-1}) + by_{k-1}$ for input samples $x_k$ and output samples $y_k$ and $$a = \frac{-A\Delta t}{2-p\Delta t}, \quad b = \frac{2+p\Delta t}{2-p\Delta t} < 1$$

where $\Delta t$ is a sampling period of said analog to digital conversion means.

6. A system as in claim 1, wherein said sampling frequency is variable and said processing means comprises means for recalculating filter coefficients of said digital integrator each time said sampling frequency is changed, where said filter coefficients are adjusted according to an actual sampling period at a time when said samples are taken and where at least one of said filter coefficients is less than one.

7. A system as in claim 6, wherein said processing means includes means for determining a new value for said peak magnitude of said output of said digital integrator using said recalculated filter coefficients.

8. A system as in claim 6, wherein said analog to digital conversion means samples said sensed voltage at a sampling frequency of at least 24 samples per cycle.

9. A system as in claim 1, wherein said sampling frequency is fixed and is at least approximately 1920 Hz.

10. A system as in claim 1, further comprising means for storing a ratio-frequency characteristic of said voltage sensor for correcting non-linear frequency response characteristics of said voltage sensor.

11. A system as in claim 1, further comprising means for storing a ratio-frequency characteristic of said digital integrator for correcting non-ideal characteristics of said digital integrator.

12. A method of protecting power equipment, supplied with energy from at least one power line, against overexcitation, comprising the steps of:

sensing a voltage of said at least one power line;

determining a frequency of said sensed voltage of said at least one power line;

sampling and digitizing said sensed voltage at a sampling frequency so as to form a digital voltage signal;

digitally integrating said digital voltage signal using a digital integrator in a manner independent of said sampling frequency;

measuring a peak magnitude of an output of said digital integrator;

calculating a voltage/frequency ratio of said at least one power line from said peak magnitude and said frequency determined in said frequency determining step;

generating an overexcitation relay signal when said voltage/frequency ratio exceeds a predetermined operating condition value; and providing said relay signal to a circuit breaker which separates said power equipment from a source of said overexcitation.

13. A method as in claim 12, wherein said sampling frequency is variable and said voltage/frequency ratio calculating step comprises the steps of adjusting filter coefficients of said digital integrator when said sampling frequency is changed and repeating said integrating and measuring steps when said digital integrator has said adjusted coefficients.

14. A method as in claim 13, wherein said filter coefficients are adjusted according to an actual sampling period at a time when said samples are taken and where at least one of said filter coefficients is less than one.

15. A method as in claim 14, comprising the further step of measuring a new value for said peak magnitude of said output of said digital integrator having said adjusted filter coefficients.

16. A method as in claim 14, wherein said sampling and digitizing step comprises the step of sampling said sensed voltage at a sampling frequency of at least 24 samples per cycle.

17. A method as in claim 12, wherein said sampling and digitizing step comprises the step of sampling said sensed voltage at a sampling frequency which is fixed and at least approximately 1920 Hz.

18. A method as in claim 12, comprising the further step of storing a ratio-frequency characteristic of a voltage sensor for correcting non-linear frequency response characteristics of said voltage sensor.

19. A method as in claim 12, comprising the further step of storing a ratio-frequency characteristic of said digital integrator for correcting non-ideal characteristics of said digital integrator.

* * * * *